United States Patent [19]

Rivoir

[11] 4,330,747

[45] May 18, 1982

[54] MEASURING MECHANISM FOR WIDE-ANGLE MOVING COIL SYSTEMS AND METHOD FOR ITS ASSEMBLY

[76] Inventor: Karl H. Rivoir, Am Nagoldhang 5, 7530 Pforzheim, Fed. Rep. of Germany

[21] Appl. No.: 186,000

[22] Filed: Sep. 9, 1980

Related U.S. Application Data

[63] Continuation of Ser. No. 51,214, Jun. 22, 1979, which is a continuation-in-part of Ser. No. 838,395, Sep. 30, 1977, Pat. No. 4,208,628.

[30] Foreign Application Priority Data

Oct. 6, 1976 [DE] Fed. Rep. of Germany ....... 2645068
Jul. 4, 1978 [DE] Fed. Rep. of Germany ....... 2829265

[51] Int. Cl.$^3$ ............................................. G01R 5/08
[52] U.S. Cl. ................................ 324/150; 324/151 R
[58] Field of Search ............... 324/150, 151 R, 151 A; 335/222, 224

[56] References Cited

U.S. PATENT DOCUMENTS

| | | | |
|---|---|---|---|
| 2,848,662 | 8/1958 | Barry et al. ......................... | 324/150 |
| 3,237,103 | 2/1966 | Kunz et al. ......................... | 324/150 |
| 3,378,768 | 4/1968 | Hautmann ........................... | 324/150 |
| 3,962,633 | 6/1976 | Nadeau .............................. | 324/150 |
| 4,208,628 | 6/1980 | Rivoir ................................ | 324/150 |

FOREIGN PATENT DOCUMENTS 937479 1/1956 Fed. Rep. of Germany ...... 324/150

*Primary Examiner*—David K. Moore
*Attorney, Agent, or Firm*—Toren, McGeady and Stanger

[57] ABSTRACT

A measuring mechanism for a wide-angle moving coil measuring system and a method for its assembly. The mechanism includes concentrically arranged inner and outer pole rings. The rings terminate in arms between which a slot or spacing is arranged. The spacing is accessible from outside the mechanism in which spacing is a pre-assembled movable part having an axle or two axle-stubs, and moving coil frame is inserted into the internal space of the inner pole ring. The magnets are arranged to be positive-locked with the pole rings. Two arrangements of magnets cooperating with the pole rings are disclosed. Various embodiments and methods of assembly are disclosed.

9 Claims, 11 Drawing Figures

MEASURING MECHANISM FOR WIDE-ANGLE MOVING COIL SYSTEMS AND METHOD FOR ITS ASSEMBLY

CROSS REFERENCE TO RELATED APPLICATIONS

This is a continuation of application Ser. No. 051,214, filed June 22, 1979, which is a continuation-in-part application of Ser. No. 838,395, filed Sept. 30, 1977, now U.S. Pat. No. 4,208,628.

BACKGROUND OF THE INVENTION

1. Field of the Invention

The invention relates to a measuring mechanism for wide-angle moving coil systems, consisting of a mount with a movable part, an inner and an outer pole ring and one or two magnets. The invention relates further to a method for assembling the parts.

2. Background of the Prior Art

With known measuring mechanisms of the initially described type, the movable part of the measuring mechanism can be mounted and balanced only inside the magnetic system. These operations, however, are a very great waste of time and impose a great burden on assembly personnel. Because of the simultaneous incorporation of heavy and highly sensitive parts in a single operating step, a further potential danger is that of damaging sensitive measuring mechanism pivots and bearings. To mechanize and/or economize on these operations is practically impossible.

A further drawback of these known measuring mechanisms is that the pole rings and magnets have to be screwed or bonded together in an expensive way. Because it is very expensive to insert bores or the like into permanent magnets, the screw coupling is extremely expensive.

A further difficult requirement is that the parts need to be arranged concentrically and for this purpose require adjustment. This operating stage is necessary because otherwise the scalar linearity of the measuring mechanism cannot be guaranteed. A mutual bonding of the parts requires considerably complex apparatus. Despite this complexity, however, usually the desired degree of concentricity is not reached and, further, cannot be corrected, which has detrimental effects. The above noted costs of final assembly of the measuring mechanism and its final adjustment must also be considered.

An object of the invention then is to provide a measuring mechanism for wide-angle moving coil systems, where together with an extensive reduction in production and assembly costs, the required concentricity of magnetic system components and, accordingly, the desired linearity of measuring mechanism readouts can be accomplished. Specific fabrication aims are a simplification of laborious assembly operations and avoidance of adjusting operations. These problems arise for the above noted wide-angle moving coil systems, where the pointer, and therewith the moving coil frame, must sweep a wide angle, e.g., of 250°. In this case, the discussed problems of concentricity and linearity are substantially more difficult to manage than with so-called 90°-instruments, i.e., where moving coil frame and pointer sweep only a 90°-angle, and where part of the negative eccentricity effects produced on instrument linearity are cancelled. This is so because the coil at diametrically opposed positions dips twice into the magnetic field. But with so-called 250° or wide-angle systems—in contrast with 90°-systems—there is no compensation for momentary deviation effective at both coil sides.

As stated above, the present invention, as originally set forth in the parent application and as further described herein, relates to a measuring mechanism for wide-angle moving coil systems, comprising a mount with a movable part, a magnetic system with an inner and an outer pole ring and one or two magnets. For this purpose, it is suggested that a form-locking arrangement of the magnet or magnets and the pole rings relative to each other be provided in such a manner that the pole rings are mutually centered and fixed in this position in any direction, wherein each of both pole rings terminates in two arms or ends between which a slot or spacing is arranged, wherein, further, the internal space of the inner pole ring serving to receive the corresponding parts of the movable part, for example, a part of its moving coil frame, is accessible from the outside through the slot arranged between its arms. The width of the slot is dimensioned in such a way that the finished movable part can be moved with its parts through the slot in the internal space of the inner pole ring.

For the assembly of the magnetic system, it is further provided that one of the support arms of the measuring mechanism carrier belonging to the frame, preferably the support arm which is the upper support arm during assembly which carries the axle bearings, has external dimensions whose projection on the magnetic system slid onto the movable part is located between the arms or ends of the outer pole ring when this ring is in the appropriate pivoting position.

The measuring mechanism according to the parent application has been successful. A primary object of the present improvement resides in, while maintaining a wide angular deflection, for example, 250°, achieving a higher stability with the dimensions of the measuring mechanisms remaining the same, or even achieving smaller dimensions of the measuring mechanisms with the stability being the same.

SUMMARY OF THE INVENTION

In accordance with the invention, a measuring mechanism for wide-angle moving coil systems comprises a mount with a movable part and a magnetic system. The magnetic system includes an inner and an outer pole ring and two magnets. A form-locking arrangement of the magnets and pole rings relative to each other is provided such that the pole rings are mutually centered and fixed in this position in any direction. Each of the two pole rings terminates in two arms between which there is arranged a slot or spacing. The inner pole ring has an inner space for receiving the corresponding parts of the movable part, including a part of a moving coil frame. The inner space is accessible from the outside through the slot arranged between the arms of the inner pole ring. The width of the slot is dimensioned in such a way that the pre-assembled unit including the mount and movable part and other corresponding parts can be inserted through the slot into the internal space of the inner pole ring. The measuring mechanism also comprises a measuring mechanism carrier including support arms which extend over the magnetic system and support the magnetic system and the movable part. The movable part has external dimensions whose projection on the magnetic system extends, independent of its rotary position, over the magnetic system, particularly over the region of the outer pole ring. The pole rings are dimensioned relative to each other and to the movable part so that they can be brought into operating position in or through the movable part.

According to the invention, in a method for the assembly of the measuring mechanism for a wide-angle moving coil system having a mount with movable part and a magnetic system having inner and outer pole rings and two magnets, wherein the mount with movable part includes a frame for supporting an axle of the movable part, the method includes the steps of initially pre-assembling, counterbalancing and adjusting the mount with movable part itself. The method also includes the steps of placing the inner pole ring within the outer pole ring, shifting the pole rings relative to each other so that an enlargement of the air gap occurs on one side and subsequently inserting an arm of the inner pole ring into the frame. The frame has an inner part on which the axle is arranged and an outer part. The method also includes moving the inner frame part into a slot between the arms of the inner pole ring and moving the outer frame part into the enlarged air gap, shifting or turning both pole rings in their place in final operating position and subsequently fixing the rings in form-locking manner in their operating position by means of the magnets.

For a better understanding of the present invention, reference is made to the attached drawings and the following detailed description, while the scope of the invention will be pointed out in the appended claims.

DESCRIPTION OF THE DRAWINGS

In the drawings:

FIG. 1 shows a plan view of a measuring mechanism according to the invention.

FIG. 2 is a sectional view taken along line II—II of FIG. 1.

FIG. 3 illustrates a measuring mechanism according to FIGS. 1, 2 at an intermediate assembly stage.

FIG. 4 is a plan view of another embodiment of a magnetic system according to the invention without mount and moving part.

DETAILED DESCRIPTION OF THE INVENTION

Figure 1:
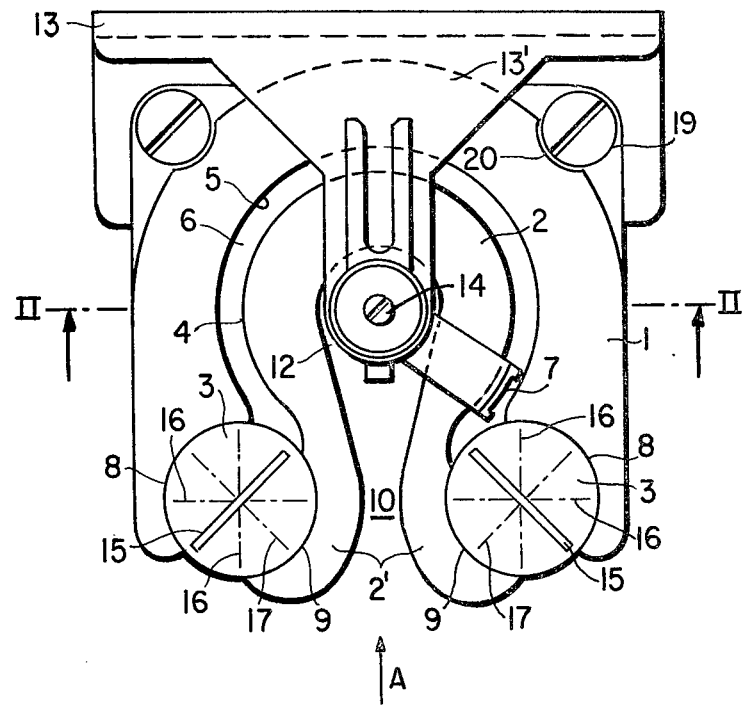
FIGS. 1–4 correspond to the disclosure of the parent application.
Figure 2:
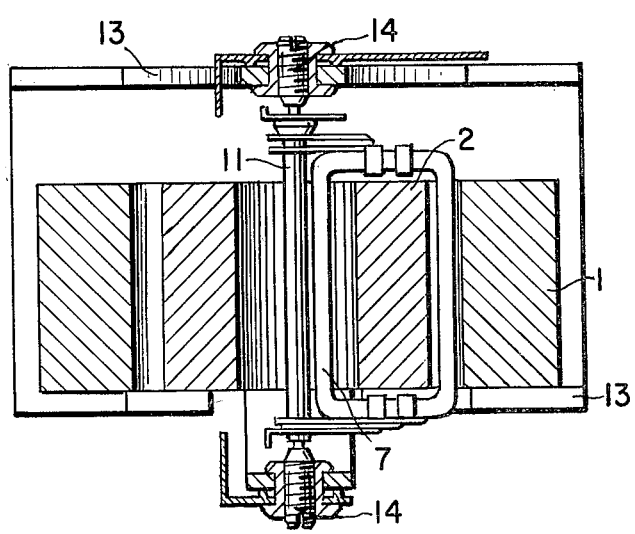

Referring initially to FIGS. 1 and 2, the magnetic system of the measuring mechanism consists of outer pole ring 1, inner pole ring 2 and magnets, which in the embodiment of FIG. 1, are shown to be two cylindrical permanent magnets. Magnets and pole rings can be parts of a simple extruded or sintered type, which may be manufactured to a very accurate shape.

The positive-locking development of these parts and mutual arrangement thereof insures that the pole rings 1, 2 are exactly mutually centered and, in this position, are fixed in any direction of the plane of projection shown in FIG. 1.

In the FIG. 1 embodiment, both pole rings are developed as part of a cylinder ring. Between the outer circumference 4 of inner pole ring 2 and the inner circumference 5 of outer pole ring 1, a cylindrical air gap 6 is located for the pickup and rotation of moving coil frame 7. The concentricity of pole rings 1, 2 to each other and their fixed arrangement in each direction of the plane of projection of FIG. 1 (and the concentric run of air gap 6 and consequently produced homogeneity of the magnetic field in said air gap) are insured by outer pole ring centering surfaces 8 and inner pole ring centering surfaces 9. These surfaces are located at the ends or arms of the pole rings and so interact.

In this embodiment, the positive-lock centering takes place via both interpolated magnets 3. Magnets 3 are so shaped and dimensioned that their outer areas are positive-locked to centering surfaces 8, 9. The centering surfaces 8, 9 and the magnets are developed cylindrically and/or as cylindrical surfaces. Arms 2' of inner pole ring 2 project into the area of the outer pole ring and are outwardly angled with their centering surfaces-equipped ends. Between arms 2', a slot 10 is located. The width of the slot is selected so that the axle 11 (see FIG. 2) of the movable part, and the inner part of frame 7, are insertable from the outside in arrow direction A into the inner space 12 of inner pole ring 2, and/or that the inner pole ring 2 with its slot 10 can be slid over the axle 11 and the inner part of frame 7.

Figure 3:
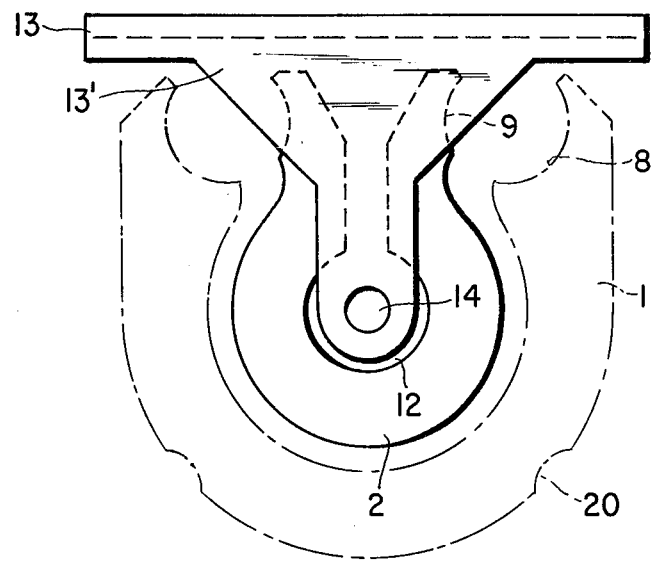

The assembly is so arranged that the axle 11 together with frame 7, the measuring mechanism carrier 13, and axial bearings 14, as a unit is pre-assembled, counterbalanced and adjusted. Subsequently, the structural unit consisting of the above parts is brought to an intermediate assembly stage as shown in FIG. 3 by inserting it into slot 10, however, whereby the outer pole ring 1 and magnets 3 are not yet assembled. Subsequently, in this example of embodiment, shown in FIG. 3, the outer pole ring 1 is axially slid from above over inner pole ring 2 into an intermediate position as indicated by dash-dot lines in FIG. 3, whereby the spacing between the ends of the outer pole ring is directed toward measuring mechanism carrier 13. Subsequently, in this embodiment, both pole rings 1, 2 together are turned by 180° around axis 11 to the position as shown in FIG. 1.

It is obvious that with the above explained embodiment of the assembly of the measuring mechanism, the outer pole ring 1 can be shifted to the position shown by dash-dot lines shown in FIG. 3 via upper carrier arm 13' of measuring mechanism carrier 13 only if the spacing between the ends of outer pole ring 1 somewhat exeeds the projection and/or contour of carrier arm 13'.

Following that, the magnets 3 are inserted and/or compressed between the pole ring areas 8, 9, so that both pole rings and both magnets are locked together. Finally, the outer pole ring is exactly positioned, and also the magnetic system with respect to the measuring mechanism, e.g., by means of alignment pins (not shown). For this purpose, both fastening screws 19 of the measuring mechanism carrier can be used, which screws project into recesses 20 of the outer pole ring. It is understood that the above noted means of positioning can be inserted and/or screwed in only after the magnetic system already has been turned to the final position according to FIG. 1.

The above described locking of parts takes place at the centering surfaces 8, 9. Compressing these parts together in conjunction with the above explained positive-locking insures a particularly flawless centering and mutual hold of magnetic system parts on each other without having to provide additional separate attachment means such as screws or the like for the mutual hold.

The cylindrical-circular magnets 3 each have a slot 15. The magnets themselves are magnetized according to the drawn-in dash-dot lines 16, that is, both magnets either are alternately in the horizontal or the vertical-drawn axis 16. Subsequently, they are rotated over slot 15 by means of a screwdriver so that the magnet directions run along the dotted lines 17. The torsional potential by means of slot 15 also allows for a certain correction of linearity. If, in special cases, a nonlinear instrument scale is desired, then the linearity can be adjusted asymmetrically by rotating one of the magnets.

Figure 4:
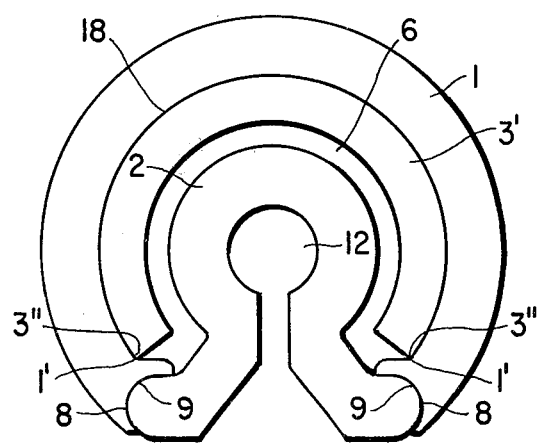
Figure 5:
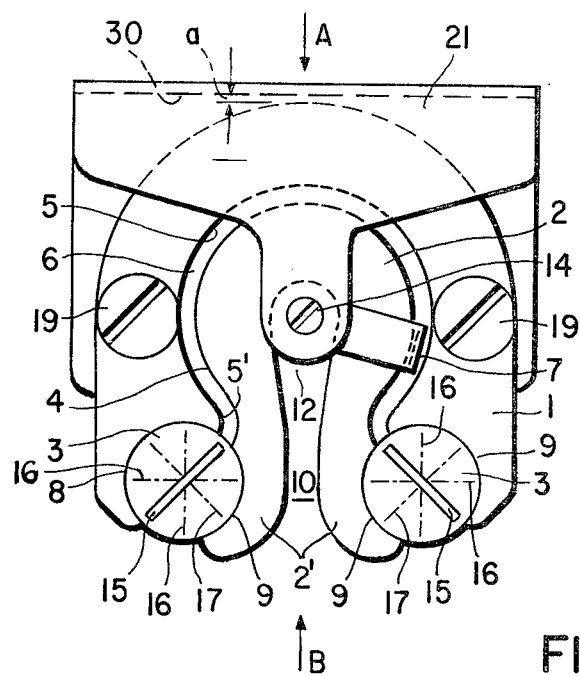
FIG. 5 shows a top view of a measuring mechanism designed in accordance with the invention.

According to the embodiment of FIG. 4, a centering (and also linearity and a mutual support of parts) can be accomplished by means of positive locking of centering areas so that the centering areas 8 of the outer pole ring ends, and the centering surfaces 9 of the inner pole ring arms are directly adjoined. Magnet 3' is developed in the shape of a semi-circular ring and abuts on the inner circumference of the outer pole ring. Between the magnet and the outer circumference of the inner pole ring an air gap 6 is again located. In this embodiment, a mutual compressing effect is produced between both pole rings along centering surfaces 8, 9, and between magnet 3' and outer pole ring along the area 18. Thus, by this embodiment, the use of any separate attachment means can be avoided by the mutual compression of pole rings and the magnet. The advantage of the embodiment according to FIG. 4 is that a very inexpensive material can be used for the magnets, namely, synthetic material-bonded magnets, which can be very economically manufactured in any given shape. A further provision is made that the cylindrically shaped magnet 3' is forced to assume any desired position in a circumferential direction by abutting the edges 3'' of magnet 3' on the angles 1' of the outer pole ring 1.

In most other respects (and specifically that concerning the assembly of parts) the discussion concerning FIGS. 1 and 2 also applies to the embodiment according to FIG. 4. The only difference is that here the outer pole ring together with the circular-shaped magnet 3' is slid over the inner pole ring 1, which coincides with the mutual compression of both pole rings.

It has been shown above that the objects of the invention have been met by providing a positive-locking arrangement of magnets or magnet and pole rings of a mutually effective type, so that the pole rings are mutually centered and fixed in this position in any direction. In this manner, each of both pole rings terminates in two arms or ends, between which a slot or spacing is arranged. The internal space of the inner pole ring used for carrying the axle or other elements of the movable part and part of its moving coil frame is accessible from the outside via the slot set between its arms or ends. The slot width is so dimensioned that the finished mount with its axle or other elements and corresponding frame part can be inserted through the slot in the internal space of the inner pole ring. One of the axial bearing-carrying arms of the mount-associated measuring mechanism carrier, preferably the upper assembly carrier arm, externally can be so dimensioned that its projection on the mount inserted magnetic system lies corresponding to the pivoting position of the external pole ring between the arms or ends of the pole ring.

This structure results in several advantages. The slot between the arms or ends of the inner pole ring and also the corresponding spacing between the arms or ends of the outer pole ring do not enter into the magnetic resistance of the magnetic system, because they do not lie in the magnetic circuit. The magnets or pole rings, which can be made of simple extruded or sintered parts, already achieve their required alignment, i.e., mutual concentric orientation, by their arrangement in a composite state. Thus, because the desired indicator linearity is produced, a calibration is no longer required. A screw coupling or bonding of parts can be relinquished. A dimensioning of the measuring mechanism carrier arm, performed after the inner pole ring is slid over the measuring mechanism axle or elements and frame part, allows for sliding the outer pole ring over the inner pole ring.

Accordingly, what remains is to turn both pole rings into the definite operating position and, if required, to insert the magnets. This makes it feasible to mount, balance and adjust the mount consisting of bearing- and measuring mechanism carriers, and the movable part, i.e., the light-weight parts of the measuring mechanism, by themselves outside of the heavy pole rings and magnets. The assembly of the light parts is separated from the subsequent assembly of the heavy parts of the measuring mechanism. With the use of the invention, a substantially simpler and more accurate manufacture and assembly is accomplished, not only of the mount with rotary part, but also of the magnetic system and specifically related to the latter's mutual holding and centering of its parts.

According to a preferred embodiment as described above, the pole rings and the magnet, and/or the magnets are compressed or locked together and attached to each other by press fit. In this manner, an additional degree of economy and simplified assembly is accomplished simultaneously with an improved accuracy (concentricity) and a particularly strong hold of magnetic system components on each other. The danger of damaging sensitive axle and bearing has been substantially reduced.

The invention also is directed to a method for assembling the magnetic system of a wide-angle moving coil system with an associated mount having a movable part. For this purpose, the mount with movable part is itself first counterbalanced and adjusted in a pre-assembled state. Subsequently, the mount with movable part is inserted into the inner pole ring. Then the outer pole ring is slid over it, both pole rings are turned. In any given case, the magnets are inserted, and the pole rings and/or pole rings and magnets together are compressed. This produces the advantages described above.

It should be understood that the invention encompasses moving coil instruments equipped with a measuring mechanism according to the invention. Such instruments typically include a housing, means for supplying an electrical parameter to be measured and a scale for displaying the measured parameter.

It is possible to construct an embodiment wherein the axle 11 is replaced by two axle stubs which are not long enough to engage in the inner space 12.

The following discussion considers the aspect of the present invention relating to FIGS. 5-11. In principle, the measuring mechanism of the present invention consists of the movable part, the magnetic system at the frame, and the measuring mechanism carrier belonging to this frame. To facilitate understanding, the numbers of FIGS. 1-4 have been maintained as much as possible in the following with respect to FIGS. 5-11.

The magnetic system of the measuring mechanism consists of the outer pole ring 1, the inner pole ring 2 and the two magnets 3. The magnets and the pole rings may be simple parts of the extruded or sintered type which can be manufactured to a very accurate shape. The form-locking design and arrangement of these parts relative to each other insure that the pole rings 1, 2 are exactly centered relative to each other and, in this position, are fixed in any direction of the plane of the drawing illustrated in FIG. 5.

In the present embodiment, the two pole rings are each constructed as a part of a cylinder ring. Between the outer circumference 4 of the inner pole ring 2 and the inner circumference 5 of the outer pole ring 1, there is located a cylindrical air gap 6 for the pickup and the rotation of moving coil frames 7. The concentricity of pole rings 1, 2 relative to each other and their fixed arrangement in each direction of the plane of the drawing of FIG. 5 and, thus, the homogeneity and concentric run of the air gap 6 are insured by centering surfaces 8 of the outer pole ring and centering surfaces 9 of the inner pole ring which are arranged at the ends or arms of the pole rings and interact with each other.

In the present embodiment, the form-locking centering is effected through the two magnets 3 arranged therebetween. The magnets 3 are shaped and dimensioned in such a way that their outer surfaces are joined in a form-locking manner to the centering surfaces 8, 9. In accordance with the embodiment, the centering surfaces 8, 9 and the magnets can be constructed cylindrically or as cylindrical surfaces. However, other shapes of the magnets and the centering surfaces are also possible. When modern magnets are used, for example, samarium cobalt magnets, other advantageous embodiments of magnets with rectangular cross sections and corresponding shapes of the centering surfaces are also conceivable. In the above-mentioned example, the magnets may be relatively thin plates.

The arms 2' of the inner pole rings 2 project into the area of the outer pole ring and are bent outwardly with their ends which are provided with the centering surfaces 9. A slot 10 is located between the arms 2'. The width of the slot is selected so that the axle 11 of the movable part, and the inner part of the frame 7, can be inserted from the outside in the direction of arrow A into the inner space 12 of the inner pole ring 2, or the inner pole ring 2 can be slid with its slot 10 over the axle 11 and the inner part of frame 7.

Figure 6:
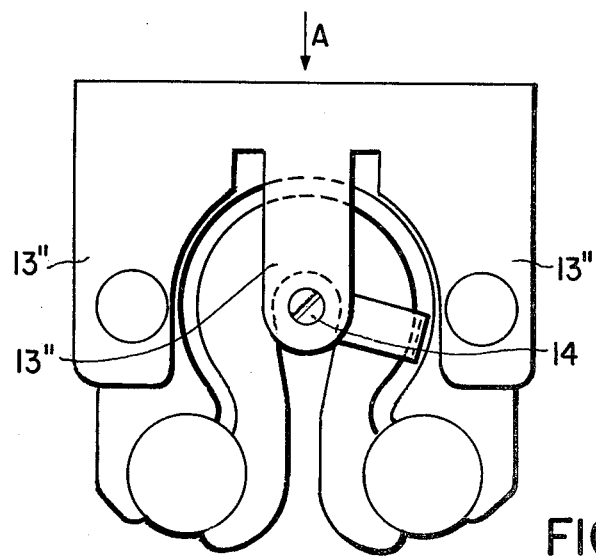
FIG. 6 shows the corresponding bottom view.
Figure 7:
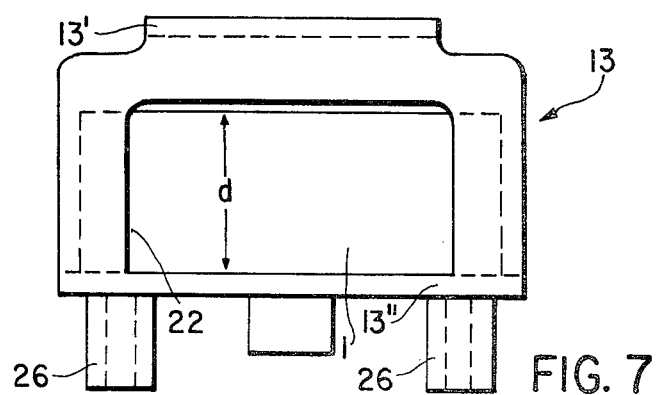
FIG. 7 shows a view according to arrow A.

The measuring mechanism carrier 13 is provided, as seen in the drawing, with an upper arm 13' and, as seen in FIG. 6, a lower arm 13", the arm 13" being divided into three individual arms of which the one in the middle carries one of the axle bearings 14, while the other axle bearing is in the upper arm 13'. The magnetic system rests on the two outer arms 13" of the lower arms of the measuring mechanism carrier and is mounted thereon by means of the screws 19 which extend through the outer pole ring 1. The terms "lower" and "upper" are always to be understood with reference to the illustration of the drawings.

It can be seen that both arms 13' and 13", particularly the upper arm 13' of the measuring mechanism carrier 13, have external dimensions whose projections extend over the pole rings 1, 2 independently from their turning positions, and particularly over the region of the outer pole ring. This is also true if the pole rings were turned by 180° in their plane relative to the illustration of FIG. 5. The under mentioned advantages are achieved by this enlargement of the arms of the measuring mechanism carrier, particularly of the upper arm 13'.

The distance a between the outer surface of the outer pole ring 1 and the inner surface 21 of the rear wall 30 of the measuring mechanism carrier extending parallel to the outer surface is kept very small, which results in a further reduction of the structural size. In this connection, it is advisable to provide the rear wall 30 with a cutout 22 (see FIG. 7) which extends to the lower support arm 13" of the measuring mechanism carrier, but is somewhat higher than the thickness d of the pole rings. This facilitates the mounting of the magnetic system which shall be explained below.

Finally, for keeping the magnetic force constant over a turning angle as wide as possible, the invention provides that the inner circumference 5 of the outer pole ring 1 extends concentrically to the magnet 3 as far as the frame moves (see reference numeral 5').

Figure 8:
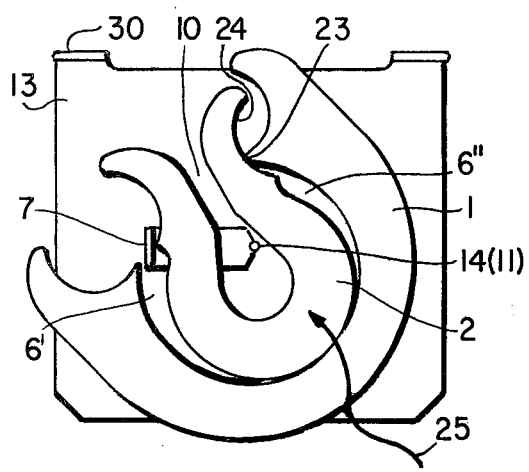
FIGS. 8 to 11 show various assembly stages of the magnetic system of a measuring mechanism according to FIGS. 5 to 7.

The assembly is so arranged that the axle 11, together with the frame 7, the measuring mechanism carrier 13 and the axle bearings 14, is pre-assembled as a unit, counterbalanced and adjusted. Subsequently, the magnetic system of this embodiment is mounted in accordance with FIGS. 8 to 11 as follows:

The two pole rings 1, 2 are placed within each other and eccentrically shifted relative to each other so that the air gap is enlarged unilaterally in accordance with reference numeral 6' and is made smaller on the other side in accordance with reference numeral 6". One arm, as seen in the drawing of FIG. 8, the left arm of the inner pole ring 2 is inserted into the frame 7, so that the inner frame part which carries the axle 11 or the axle bearings 14 reaches the slot 10 between the arms of the inner pole ring 2. The outer part of this frame is inserted in the enlarged air gap 6'. In doing so, the pole rings 1, 2 are further shifted in their plane, as can be seen from FIGS. 9 to 11 and as shall be explained in further detail below.

At the beginning of this assembly procedure and the "threading-in" of the frame as shown in FIG. 8, it is advisable that the inner corner 23 of the arm of the outer pole ring 1 forming the smaller air gap 6' engages the concave recess 24 of the end of the adjacent arm of the inner pole ring 2. This "threading-in" of the frame may be accomplished by moving the two pole rings 1, 2 along a winding line approximately in accordance with arrow 25.

Figure 10:
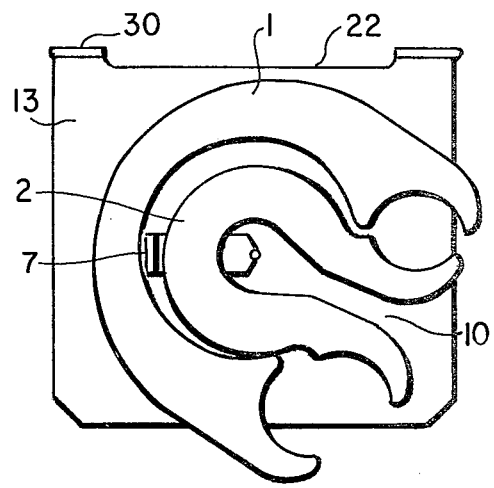
Figure 9:
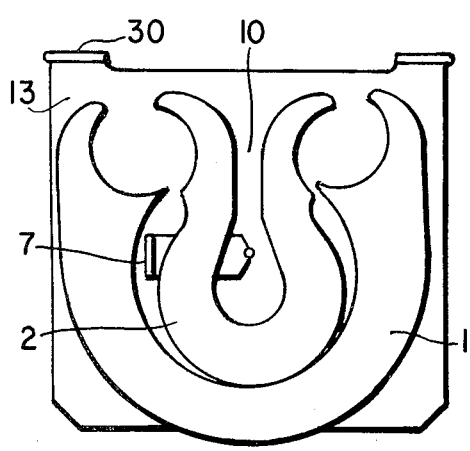
Figure 11:
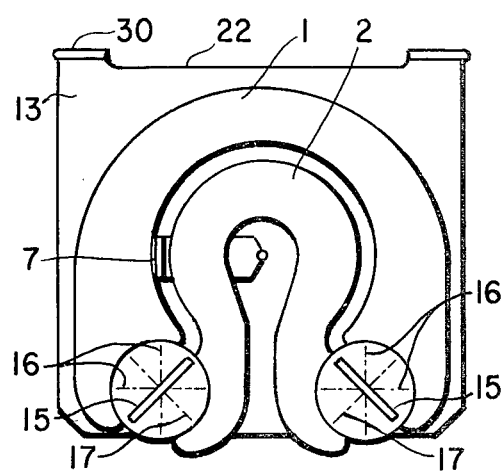

After the pole rings 1, 2 have reached the position according to FIG. 9, they are turned in their plane by 180° until they reach, through the intermediate position according to FIG. 10, the operating position according to FIG. 11. The above-explained cutout 22 is an advantage in this connection, since the outer ends of the pole ring arms can be passed through the cutout 22 during the above-indicated turning procedure; as a result, the structural size of the measuring mechanism carrier can be kept relatively small.

In the position according to FIG. 11, the fastening screws 19 are passed through bores of the outer pole ring and are screwed into the lower support arm 13" or, respectively into the threaded pipes 26 arranged at the lower support arm 13". Subsequently, the magnets 3 are inserted between the surfaces 8, 9; as a result, the magnetic system is supported in a form-locking manner. The support can additionally be effected in a force-locking manner thereby that the magnets are pressed between the surfaces 8, 9, so that the two pole rings and the two magnets are clamped tightly together. The above-mentioned fastening screws 19 serve for an exact positioning of the outer pole ring and, thus, of the magnetic system relative to the measuring mechanism carrier.

The cylindrical circular magnets 3 each have a slot 15. The magnets themselves are magnetized according to the dash-dot lines 16, that is, both magnets either are alternately in the horizontal, or both magnets are in the vertically drawn axis 16. Subsequently, they are rotated over slot 15 by means of a screwdriver so that the magnet directions run along the broken lines 17. This rotation by means of the slots 15 further allows for a certain correction of linearity. If, in special cases, a nonlinear scale is desired, the linearity can also be adjusted asymmetrically by rotating one of the magnets.

Thus, in a measuring mechanism for wide-angle moving coil systems in accordance with the present invention, the pole rings can no longer be mounted in a very simple manner, as suggested in the parent application. However, the enlargement of the area of the support arm as suggested by the invention, also facilitates the assembly of the magnetic system, wherein a higher stability is now achieved while maintaining the structural size, or a smaller structural size is achieved while maintaining the stability, without having to give up a large, constant magnetic force through a wide turning angle of the system. Accordingly, the high accuracy of the moving coil system according to the parent application is maintained. This is particularly important when instruments equipped with this system are to be used under extreme conditions (for example, when mounted in ships, aircraft, cross-country vehicles and the like).

As indicated above, in one embodiment, the pole rings, when arranged within each other, can be shifted and rotated in their plane into the operating position. As a result, the desired assembly can be achieved with the use of conventional magnets and the desired small dimensions of the magnetic system and a relatively small air gap can be realized. In the above, the phrase "in their plane" refers also to an arrangement of the pole rings which, relative to their vertical positions which they assume during operation, are lifted to a small extent, are shifted in this lifted position and, subsequently, are lowered into the operating position.

Furthermore, the invention as described relates to a method for the assembly of the measuring mechanism in accordance with the method first disclosed in the parent application, the frame with the movable part is at first by itself pre-assembled, balanced and adjusted. For this purpose, the invention proposes certain features which allows, as a result, the magnetic system to be assembled in a manner which is simple and can be relatively easily manipulated, and this without having to take into consideration the dimensions of the measuring mechanism carrier, particularly its support arm.

It is apparent that the proposed arrangement and method of assembly makes it possible to bring the magnetic system into the desired operating position in an especially simple manner, and this while maintaining a relatively small air gap and, furthermore, maintaining the structural features and advantages which were explained above, such as small structural size, high stability and wide turning angle for measuring.

While the foregoing description and drawings represent the preferred embodiments of the present invention, it will be obvious to those skilled in the art that various changes and modifications may be made therein without departing from the true spirit and scope of the present invention.

What is claimed is:

1. A measuring mechanism for wide-angle moving coil systems, comprising: a mount with a movable part, and a magnetic system including an inner and an outer pole ring and two magnets, wherein a form-locking arrangement of said magnets and said pole rings relative to each other is provided such that said pole rings are mutually centered and fixed in this position in any direction, wherein each of said two pole rings terminates in two arms between which there is arranged a slot or spacing, said inner pole ring having an inner space for receiving the corresponding parts of said movable part including a part of a moving coil frame, which inner space is accessible from the outside through the slot arranged between the arms of said inner pole ring and the width of said slot is dimensioned in such a way that the pre-assembled unit including said mount and said movable part and its corresponding parts can be inserted through said slot into said internal space of said inner pole ring, said measuring mechanism also comprising a measuring mechanism carrier including support arms which extend over said magnetic system and support said magnetic system and said movable part, said support arms having external dimensions whose projection on said magnetic system extends, independent of its rotary position, over said magnetic system, particularly over the region of said outer pole ring, and said pole rings being dimensioned relative to each other and to said movable part so that they can be brought into the operating position in or through said movable part.

2. A measuring mechanism according to claim 1, wherein said pole rings, when arranged within each other, can be shifted and rotated in their plane into the operating position.

3. A measuring mechanism according to claim 1, wherein, in the operating position, said outer pole ring almost rests against the rear wall of said measuring mechanism carrier which extends parallel to the axis of rotation of said measuring mechanism.

4. A measuring mechanism according to claim 1, wherein, in said rear wall of said measuring mechanism carrier, a cutout is provided which reaches to the lower support arm of said measuring mechanism carrier on which said pole rings are supported, but is higher than the thickness d of said pole rings.

5. A measuring mechanism according to claim 1, wherein the air gap between said inner and said outer pole rings is constant up to said magnets.

6. In a method for the assembly of the measuring mechanism for a wide-angle moving coil system having a mount with movable part and a magnetic system having inner and outer pole rings and two magnets, said mount with movable part including a frame for supporting an axle of the movable part, said method including the steps of initially pre-assembling, counterbalancing and adjusting the mount with movable part itself, then placing the inner pole ring within the outer pole ring, shifting the pole rings relative to each other so that an enlargement of the air gap occurs on one side, subsequently inserting an arm of the inner pole ring into the frame, the frame having an inner part on which the axle is arranged and an outer part, moving the inner frame part into a slot between the arms of the inner pole ring and moving the outer frame part into the enlarged air gap, shifting or turning both pole rings in their plane into final operating position and subsequently fixing the rings in form-locking manner in their operating position by means of the mangets.

7. A method according to claim 6, including the step of pressing said two pole rings onto said magnets.

8. A method according to claim 6, including the step of, initially, moving said two pole rings toward a rear wall of a measuring mechanism carrier for holding said mechanism at an angle relative to said rear wall, preferably in a winding line.

9. A method according to claim 6, wherein, during the step of moving said two pole rings eccentrically relative to each other and wherein during the step involving said frame inserting an inner corner of one arm of said outer pole ring in a concave recess of the adjacent arm of said inner pole ring.

* * * * *